United States Patent
Krivokapic et al.

[11] Patent Number: 6,091,123
[45] Date of Patent: Jul. 18, 2000

[54] SELF-ALIGNED SOI DEVICE WITH BODY CONTACT AND NISI$_2$ GATE

[75] Inventors: Zoran Krivokapic, Santa Clara; Shekhar Pramanick, Freemon, both of Calif.

[73] Assignee: Advanced Micro Devices, Sunnyvale, Calif.

[21] Appl. No.: 09/093,580

[22] Filed: Jun. 8, 1998

[51] Int. Cl.$^7$ .................................................. H01L 21/336
[52] U.S. Cl. .......................................... 257/412; 257/347
[58] Field of Search .................................... 438/166, 151, 438/287, 300; 257/347, 412

[56] References Cited

U.S. PATENT DOCUMENTS

| | | |
|---|---|---|
| 4,716,128 | 12/1987 | Schubert et al. . |
| 4,763,183 | 8/1988 | Ng et al. . |
| 5,494,837 | 2/1996 | Subramanian et al. . |
| 5,595,923 | 1/1997 | Zhang et al. . |
| 5,851,890 | 12/1998 | Tsai et al. . |
| 5,854,509 | 12/1998 | Kunikiyo . |

OTHER PUBLICATIONS

Ghandhi, Sorab K. "VLSI Fabrication Principles" (John Wiley & Sons) Jan. 1983.
Wolf, Stanley "Silicon Processing for the VLSI Era vol. 2" (Lattice Press) 1990.
Article entitled, "Spatially Confined Nickel Disilicide Formation at 400°C On Ion Implantation Preamorphized Silicon" Author: Erokhin et al. Dec. 6, 1993.

*Primary Examiner*—George Fourson
*Assistant Examiner*—Elizabeth Abbott
*Attorney, Agent, or Firm*—Brinks Hofer Gilson & Lione

[57] ABSTRACT

A self-aligned SOI device with body contact and silicide gate. The SOI device is formed using an ordinary substrate such as silicon. A silicide gate is self-aligned and formed from re-crystallization of nickel and amorphous silicon. The self-aligned silicide gate includes gate contact areas, and is self-aligned with respect to the gate opening, the source and drain regions and a nitride isolation layer. Nickel spacers deposited adjacent the isolation layer, and amorphous silicon deposited between the nickel spacers, form the self-aligned silicide gate through a silicidation process.

7 Claims, 2 Drawing Sheets

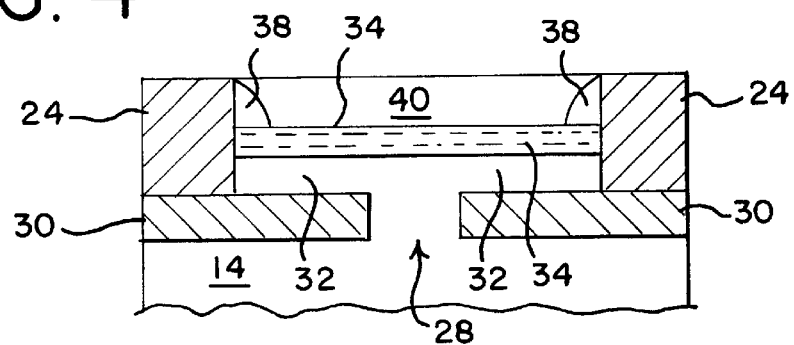
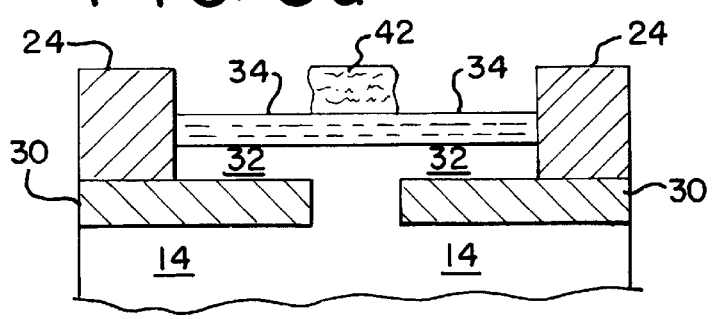
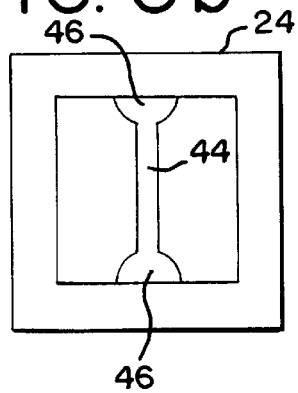
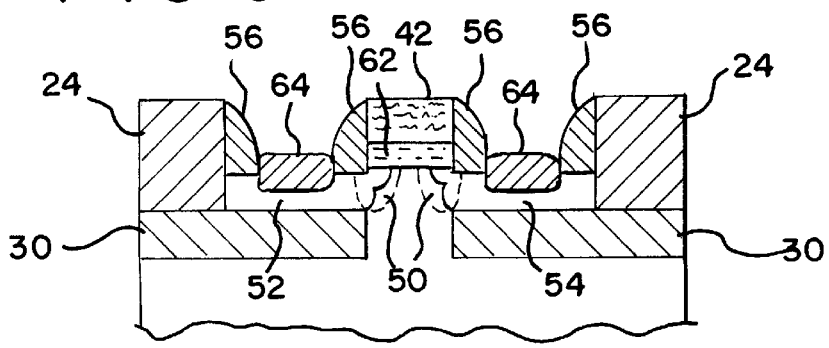

SELF-ALIGNED SOI DEVICE WITH BODY CONTACT AND NISI₂ GATE

BACKGROUND OF THE INVENTION

The present invention relates to the manufacture of semiconductor integrated circuits, and more particularly, to a self-aligned SOI device having a silicide gate and body contact.

As the push to include greater and greater device densities on a single integrated circuit continues, manufactures are looking for better or new opportunities to shrink device geometries. As device geometries decrease into deep submicron dimensions, the need for greater control and precision over the formation of thin, uniform, planar and low resistivity silicide contact layers increases. Attempts have been made to form silicide contact layers from a combination of a metal film with an amorphous as opposed to a crystalline substrate.

The silicidation process is the process of forming silicon-metal substances at the boundary between a layer of silicon and a metal layer. Amorphous silicon has also been known to react better than crystalline silicon with certain metals such as for example nickel. In deep submicron applications, therefore, the need to form self-aligned silicide gate structures becomes greater. What is lacking in the art is a structure and method for forming a self-aligned silicide gate SOI device, where the device also includes a body contact.

BRIEF SUMMARY OF THE INVENTION

In view of the above, a self-aligned SOI device and method for manufacturing same are provided. According to one aspect of the invention, a self-aligned SOI device with body contact and silicide gate is formed from ordinary substrate. An oxide layer, deposited over the ordinary substrate, is etched to provide a gate opening. An epitaxial layer is deposited over the gate opening, and a high K dielectric layer is deposited over the epitaxial layer. A self-aligned silicide gate contact, having at least one gate contact area, is disposed over the dielectric layer.

In another aspect of the invention, a method of making a self-aligned SOI device with body contact and silicide gate is provided. According to the steps of the method, an oxide layer is deposited over an ordinary substrate. The oxide layer is then etched to provide a gate opening. An epitaxial layer is deposited over the gate opening, and a high K dielectric layer is deposited over the epitaxial layer. A self-aligned silicide gate contact is formed over the dielectric layer where the gate contact includes at least one gate contact area.

The self-aligned SOI device with body contact and silicide gate can be easily manufactured according to the invention using an ordinary substrate such as silicon. These SOI devices are fully self-aligned transistors aligned throughout the isolation, source/drain and gate regions. Such devices, therefore, help provide for improved semiconductor densities.

These and other features and advantages of the invention will become apparent to those skilled in the art upon a review of the following detailed description of the presently preferred embodiments of the invention, taken in conjunction with the appended drawings.

BRIEF DESCRIPTION OF SEVERAL VIEWS OF THE DRAWINGS

FIG. 4 is a cross-sectional view of the deposition of nickel and amorphous silicon over the structure shown in FIG. 3;

FIGS. 5a and 5b are an illustration of a self-aligned silicide gate, where FIG. 5(a) is a cross-sectional view after polysilicon etching, and FIG. 5(b) is a top plan view illustrating the silicide gate and gate contract areas; and FIG. 6 is a cross-sectional view of the structure shown in FIGS. 5a and 5b illustrating the source and drain implants and silicide formation in the source and drain regions.

DETAILED DESCRIPTION OF THE INVENTION

Figure 1:
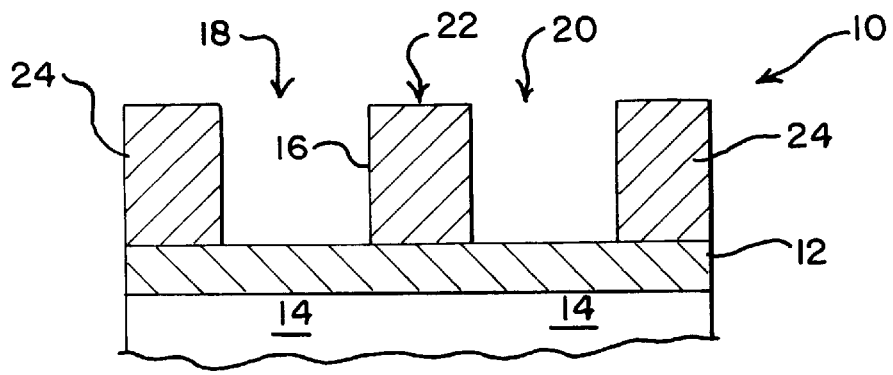
FIG. 1 is a cross-sectional view of a nitride layer deposited over a silicon substrate.

Referring now to the drawings, where like reference numerals refer to like elements throughout, one presently preferred SOI device 10 is shown generally in FIG. 1. In forming the SOI device 10, a first layer of silicon dioxide ($SiO_2$) 12 is deposited over a silicon (Si) substrate 14. Preferably, the silicon dioxide layer 12 is formed to a thickness of 100–150 nanometers. After the deposit of the silicon dioxide layer 12, a layer 16 of $Si_3N_4$ is deposited, preferably to a thickness of 250–400 nanometers. A source and drain mask (not shown) is then used to define a source area 18 and a drain area 20 in the $Si_3N_4$ layer 16. The $Si_3N_4$ layer 16 is then etched in a conventional manner to create the source and drain areas 18, 20. As a result of the process, a gate area 22 and isolation areas 24 are also defined.

Figure 2:
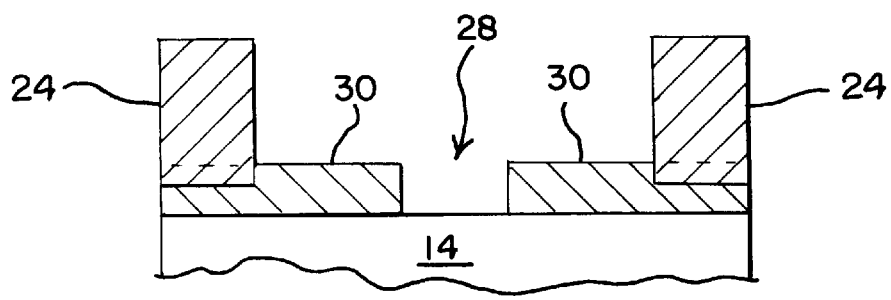
FIG. 2 is a cross-sectional view of the etching of an oxide layer deposited over the structure shown in FIG. 1 to create a gate opening.
Figure 3:
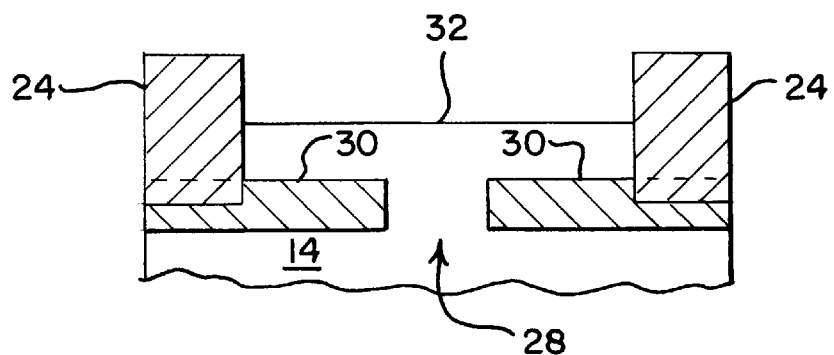
FIG. 3 is a cross-sectional view of a selective epitaxial layer deposited over the structure shown in FIG. 2.

Referring now to FIG. 2, an oxide layer 30 is deposited, preferably to a thickness of 1–1.5 micrometers. The oxide layer 30 is polished back and a gate opening mask (not shown) is applied over the structure 10. The $Si_3N_4$ layer 16 is then removed and the oxide layer 30 is etched to create the gate opening 28 shown in FIG. 2. As shown in FIG. 3, a selective epitaxial layer 32 is grown between the isolation areas 24. Preferably, the epitaxial layer 32 is grown to a thickness of 200–300 nanometers.

Referring next to FIG. 4, a high K dielectric material 34 is then deposited over the structure as shown. A nickel (Ni) layer (not shown) is deposited over the structure, preferably to a thickness of 100–200 nanometers. An anisotropic nickel etch is then performed to form the nickel spacers 38 shown in FIG. 4. Amorphous silicon (Si) 40 is then deposited over the structure. After the deposition, the amorphous silicon 40 is polished back to the level of the nitride isolation areas 24.

As shown in FIGS. 5a and 5b, nickel enhanced re-crystallization forms a layer 42 of $NiSi_2$ in the middle of the amorphous silicon layer 40. The re-crystallization process thus aligns the $NiSi_2$ layer 42 to the opening defined for the $NiSi_2$ gate 44, as shown in FIG. 5(b). Polysilicon etching is performed to leave the $NiSi_2$ layer 42, as shown in FIG. 5(a). As shown in FIG. 5(b), gate contact areas 46 are also defined at the distal ends of the $NiSi_2$ gate 44. The isolation nitride layer 24 is also shown in FIG. 5(b).

Referring to FIG. 6, a channel implant 50 is then provided as well as source and drain extension implants 52, 54. Oxide spacers 56 are then formed, and the source 18 and drain 20 are implanted. The high K dielectric layer 62 is then etched to reveal the structure shown in FIG. 6. Silicidation is then allowed to occur thus forming the silicide areas 64 shown in FIG. 6. In the presently preferred embodiment of the invention, the silicidation process is induced by thermal annealing. The thermal annealing is preferably conducted at a temperature of 350–525° C. As a result, a layer of nickel disilicide is created to a preferred thickness of 30–60 nanometers.

As can be seen, the present invention allows for the manufacture of SOI devices on ordinary substrates without creating a floating body effect. The invention thus provides for improved semi-conductor densities. The SOI devices described above further provide fully self-aligned transistors each transistor also having body contacts. The transistors are also fully self-aligned throughout the isolation, source/drain and gate regions.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

We claim:

1. A self-aligned SOI device with body contact and suicide gate comprising:

a substrate;

an oxide layer deposited over the substrate, the oxide layer being etched to provide a gate opening;

an epitaxial layer deposited over the gate opening;

a dielectric layer deposited over the epitaxial layer; and a silicide gate over the dielectric layer aligned with the gate opening.

2. The self-aligned SOI device defined in claim 1, further comprising source and drain extension implants.

3. The self-aligned SOI device defined in claim 2, further comprising oxide spacers formed in the source and drain regions.

4. The self-aligned SOI device defined in claim 3, further comprising a silicide layer formed over the source and drain regions.

5. The self-aligned SOI device defined in claim 4, further comprising at least one channel dopant deposited between the source and drain regions.

6. The self-aligned SOI device defined in claim 1, wherein the silicide gate comprises nickel silicide.

7. The self-aligned SOI device defined in claim 1, further comprising nitride isolation areas.

* * * * *

UNITED STATES PATENT AND TRADEMARK OFFICE
CERTIFICATE OF CORRECTION

PATENT NO. : 6,091,123
DATED : July 18, 2000
INVENTOR(S) : Zoran Krivokapic and Shekhar Pramanick It is certified that error appears in the above-identified patent and that said Letters Patent is hereby corrected as shown below:

Title page,
Inventors: please replace the word "Fremon" with -- Fremont --.

Column 3,
Line 23, please replace the word "suicide" with -- silicide --.

Signed and Sealed this

Twenty-fifth Day of December, 2001

Attest:

JAMES E. ROGAN
Attesting Officer       Director of the United States Patent and Trademark Office